United States Patent
Miyachi et al.

(10) Patent No.: US 12,431,888 B2
(45) Date of Patent: Sep. 30, 2025

(54) SWITCH CIRCUIT

(71) Applicant: TOYOTA BOSHOKU KABUSHIKI KAISHA, Aichi (JP)

(72) Inventors: Reina Miyachi, Toyota (JP); Naoya Hanada, Toyota (JP)

(73) Assignee: TOYOTA BOSHOKU KABUSHIKI KAISHA, Aichi (JP)

( * ) Notice: Subject to any disclaimer, the term of this patent is extended or adjusted under 35 U.S.C. 154(b) by 16 days.

(21) Appl. No.: 18/648,751

(22) Filed: Apr. 29, 2024

(65) Prior Publication Data

US 2024/0380394 A1    Nov. 14, 2024

(30) Foreign Application Priority Data

May 9, 2023 (JP) .................... 2023-077202

(51) Int. Cl.
*H03K 19/00* (2006.01)
*B60R 16/037* (2006.01)
*H02M 1/00* (2007.01)
*H03K 17/00* (2006.01)
*H03K 17/0812* (2006.01)

(52) U.S. Cl.
CPC ..... *H03K 17/08122* (2013.01); *B60R 16/037* (2013.01); *H02M 1/0003* (2021.05); *H03K 17/00* (2013.01); *H03K 19/00* (2013.01)

(58) Field of Classification Search
CPC ..... H02P 6/085; B60R 16/027; B60R 16/037; B60N 2/0224; H03K 17/08122; H03K 17/00; H03K 19/00; H03K 17/6871; H02M 1/0003; H02M 1/0032
USPC .......... 307/9.1, 112; 327/392; 361/1
See application file for complete search history.

(56) References Cited

U.S. PATENT DOCUMENTS

| | | | | |
|---|---|---|---|---|
| 2010/0066137 A1* | 3/2010 | Sakai | ........ | B60N 2/0228 297/217.3 |
| 2020/0017000 A1* | 1/2020 | Lee | ........ | B60N 2/0244 |
| 2020/0350841 A1* | 11/2020 | Honsowetz | ........ | B60N 2/0244 |
| 2022/0396178 A1* | 12/2022 | Sin | ........ | B60N 2/02246 |
| 2023/0135176 A1* | 5/2023 | Yang | ........ | B60R 16/0231 701/36 |

FOREIGN PATENT DOCUMENTS

JP    2006-20850    1/2006

* cited by examiner

*Primary Examiner* — Rexford N Barnie
*Assistant Examiner* — Joshua James Sweet
(74) *Attorney, Agent, or Firm* — Greenblum & Bernstein, P.L.C.

(57) ABSTRACT

A controller of a switch circuit is configured to execute a first determination process of determining whether a first switch is in a closed state and whether a second switch is in a closed state through a polling process, a second determination process of determining whether a state indicated by a signal input to an interrupt port has changed from the closed state to an open state, and a turn-off process of bringing a switching element in an ON state into an OFF state when the state is determined to have changed from the closed state to the open state in the second determination process.

4 Claims, 3 Drawing Sheets

SWITCH CIRCUIT

CROSS-REFERENCE TO RELATED APPLICATIONS

This application claims the benefit of Japanese Patent Application No. 2023-077202 filed on May 9, 2023 with the Japan Patent Office, the entire disclosure of which is incorporated herein by reference.

BACKGROUND

The present disclosure relates to a switch circuit that controls electric power to be supplied to a load mounted to a vehicle seat.

For example, in a switch circuit disclosed in Japanese Unexamined Patent Application Publication No. 2006-020850, while an electric motor is being supplied with a driving power, when interruption of power supply is detected, a controller brings a switching element (e.g., a field-effect transistor) that directly controls current supply to the electric motor into an OFF state.

SUMMARY

For example, in a switch circuit configured to detect respective open/closed states of two switches each operated to open and close mechanically and to turn on or off two switching elements to conform to the open/closed states of the corresponding switches, a through current may be generated when the open/closed state of each of the two switches is switched.

Operation of each of the two switching elements is controlled by a controller configured with a microcomputer. Specifically, the controller detects a signal indicating the open/closed state of each switch, and brings the switching element corresponding to the switch into an ON state or an OFF state.

When the switch is in a closed state (ON), the controller brings the corresponding switching element into an ON state. When the switch is in an open state (OFF), the controller brings the corresponding switching element into an OFF state.

When the switching element enters the ON state, a supply line for electric power enters a closed state to allow a current to flow through the supply line. When the switching element enters the OFF state, the supply line for the electric power enters an open state to allow no current to flow through the supply line.

For example, when a first switch is in a closed state (ON), a first switching element is in an ON state and a second switch is in an open state (OFF), and thus, a second switching element is in an OFF state.

Subsequently, when the state of the first switch changes from the closed state (ON) to an open state (OFF) and the state of the second switch is switched from the open state (OFF) to a closed state (ON), the controller detects such changes in the open/closed states of these switches, and switches the state of the first switching element from the ON state to an OFF state and the state of the second switching element from the OFF state to an ON state.

Here, in a case where detection by the controller of the state change of the first switch from the closed state (ON) to the open state (OFF) is delayed to be later than detection by the controller of the state change of the second switch from the open state (OFF) to the closed state (ON), a situation occurs in which the two switching elements are both in the ON state.

When the two switching elements both enter the ON state, a through current is generated, to thereby damage the switching elements. Considering such a disadvantage, the present disclosure discloses one example of a switch circuit capable of inhibiting generation of a through current.

It is desirable that a switch circuit configured to control electric power to be supplied to a load mounted to a vehicle seat comprise, for example, at least one of the following elements.

Specifically, the elements are a first switch and a second switch configured to be operated to open and close mechanically, a first switching element configured to turn on and off a first supply line for the electric power to be supplied from a power source to the load, a second switching element configured to turn on and off a second supply line for the electric power to be supplied from the power source to the load, the second supply line being arranged in parallel with the first supply line, and a controller configured with a microcomputer, to which a first signal indicating an open/closed state of the first switch and a second signal indicating an open/closed state of the second switch are input, the controller being configured to turn on or off each of the first switching element and the second switching element based on the first signal and the second signal, the first signal and the second signal being input to an interrupt port in common. The controller is configured to execute at least a first determination process, a second determination process, and a turn-off process.

The first determination process is a process of determining whether the first switch is in a closed state and whether the second switch is in a closed state through a polling process (hereinafter referred to as an "ON determination"). The polling process is a process of, for example, executing one or more processes sequentially at a specified cycle.

The second determination process is a process of determining whether a state indicated by either of the first and second signals input to the interrupt port, that is, a state of either the first switch or the second switch, has changed from the closed state to an open state (hereinafter referred to as an "OFF determination").

The interrupt port is a port to which the signals used for execution of the interrupt handling process are input. The interrupt handling process is a process executed immediately when, for example, a specified state occurs in the signal input to the interrupt port.

The turn-off process is a process of bringing either of the first and second switching elements that is in an ON state into an OFF state when the state is determined to have changed from the closed state to the open state in the second determination process, that is, when the state of the first switch or the second switch has changed from the closed state to the open state.

The determination of whether the state of the first switch or the second switch has changed from the closed state to the open state is made through the interrupt handling process, and thus, such a determination is made in an extremely short period of time as compared with a case where such a determination is made through the polling process.

Therefore, generation of a through current caused by "delay in detection timing" described above can be inhibited. This may also lead to inhibition of damage to the first switching element and the second switching element.

In the meantime, some specification of the controller and/or some specification of the vehicle seat may cause a case where the number of the interrupt port usable for the OFF determination falls short of the number of the switches. In contrast, in the above-described switch circuit, the first signal and the second signal are input to the interrupt port in common, and thus, at least one interrupt port is sufficient.

Accordingly, with this switch circuit, the turn-off process can be executed using the interrupt handling process even in the case where the number of the interrupt port usable for the OFF determination falls short of the number of the switches.

With such a configuration of this switch circuit, generation of a through current can be inhibited without employing a controller with a process speed capable of inhibiting generation of a through current through the polling process alone, or an expensive controller provided with an ample number of the interrupt ports.

In this switch circuit, since generation of a through current can be inhibited with the controller with a small number of the interrupt port, increase in size of the controller is inhibited, and thus, ease of mounting the controller to the vehicle seat is not impaired.

Moreover, the controller brings the switching element currently in an ON state into an OFF state when the OFF determination is made, and thus, the controller can immediately bring this switching element into the OFF state without determining which switch corresponding to each switching element has been opened.

This allows the switching element to enter the OFF state in an extremely short period of time, and thus, generation of a through current may be reliably inhibited.

For example, this switch circuit may be configured as below.

Specifically, it is desirable that, in the second determination process, the state be determined to have changed from the closed state to the open state when the state first changes from the closed state. In other words, it is desirable that, in the second determination process, such a determination be made based on an edge of the signal.

With such a configuration, even in a case where chattering occurs in the first switch and the second switch, the OFF determination is not affected by such chattering. This makes it possible to make the OFF determination in an extremely short period of time, thus reliably inhibiting generation of a through current.

Moreover, it is desirable that the controller be configured to execute a sleep mode, which is a standby power mode, that the controller be configured to, during the sleep mode, also execute, in addition to the second determination process, a third determination process of determining whether the state indicated by either of the first and second signals input to the interrupt port has changed from the open state to the closed state, and that the controller be configured to, when the state indicated by either of the first and second signals is determined to have changed in the second determination process or the third determination process, cancel the sleep mode and prohibit execution of the third determination process.

With such a configuration, when any operation is performed on either of the first and second switches, the sleep mode is canceled. This may enable the controller to quickly react to the operation by a user.

BRIEF DESCRIPTION OF THE DRAWINGS

An example embodiment of the present disclosure will be described below with reference to the accompanying drawings, in which.

DETAILED DESCRIPTION OF EXEMPLARY EMBODIMENTS

Figure 1:
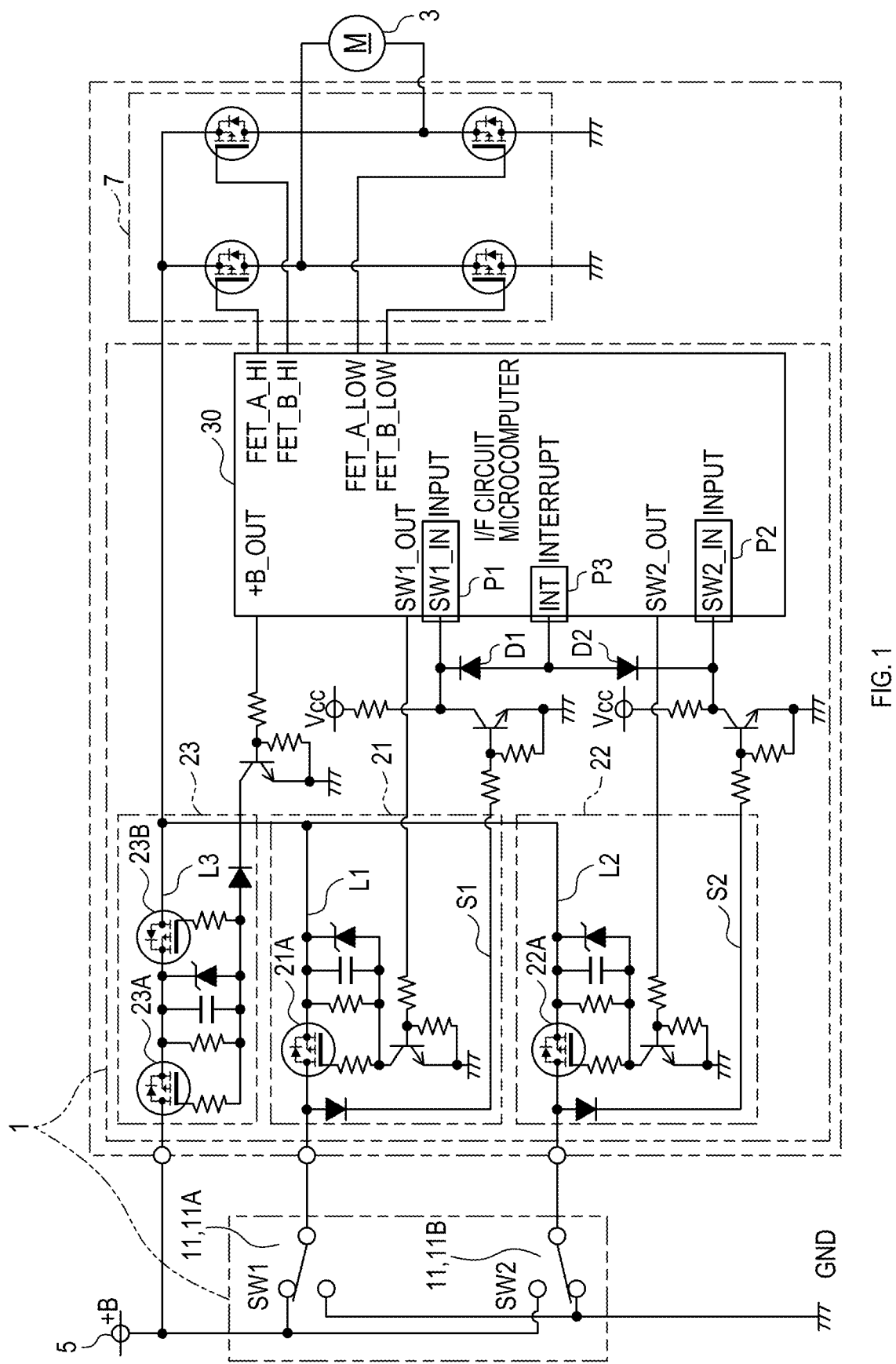
FIG. 1 is a circuit diagram of a switch circuit according to a first embodiment.

Embodiments below show examples of embodiments that fall within the technical scope of the present disclosure. That is, invention-specifying matters and so on recited in the appended claims are not limited by specific configurations, structures, and so on indicated in the embodiments below.

The embodiments below are examples in which a switch circuit according to the present disclosure is applied to a seat to be mounted in a vehicle such as an automobile (hereinafter referred to as a "vehicle seat"). A member or portion described at least with a reference numeral is at least one in number except in a case of being accompanied by a restrictive wording such as "only one".

First Embodiment

1. Overview of Switch Circuit (See FIG. 1)

A switch circuit 1 according to the present embodiment is a switch circuit that controls electric power to be supplied to a load 3 mounted to a vehicle seat (not shown). The load 3 according to the present embodiment is an electric motor.

The load 3 (hereinafter referred to as an "electric motor 3") is an electric drive source for a drive unit (not shown) for a sliding device, a reclining device, or the like. Specifically, the switch circuit 1 controls electric power to be supplied from a power source 5 mounted in the automobile to a motor bridge circuit 7 that drives the electric motor 3.

2. Configuration of Switch Circuit (See FIG. 1)

The switch circuit 1 comprises at least an operation switch 11, a first switch circuit 21, a second switch circuit 22, and a controller 30. The switch circuit 1 according to the present embodiment also comprises a third switch circuit 23.

Operation Switch

The operation switch 11 comprises at least a first switch 11A and a second switch 11B. The first switch 11A and the second switch 11B are mechanical switches to be operated to open or close by a user.

Specifically, the first switch 11A and the second switch 11B each comprise stationary contacts and a movable contact. When a user operates an operation part (not shown) of the operation switch 11, the movable contact of each of the first switch 11A and the second switch 11B comes into or out of contact with the corresponding stationary contact.

In the present embodiment, the two movable contacts are operated with a single operation part. Thus, the operation switch according to the present embodiment does not involve a situation where the first switch 11A and the second switch 11B are both in a closed state (ON).

Specifically, there are three states in the operation switch 11. In a first state, the first switch 11A is in a closed state (ON) and the second switch 11B is in an open state (OFF). In a second state, the second switch 11B is in a closed state (ON) and the first switch 11A is in an open state (OFF).

In a third state, the first switch 11A and the second switch 11B are both in an open state (OFF). When changing from the first state to the second state, and when changing from the second state to the first state, the state always changes via the third state. In other words, the state of the operation switch 11 changes in a pattern of "the first state=>the third state=>the second state" or in a pattern of "the second state=>the third state=>the first state".

First Switch Circuit

The first switch circuit 21 comprises at least a first switching element 21A. The first switching element 21A turns on and off a first supply line L1.

Specifically, when the first switching element 21A enters an ON state, the first supply line L1 enters a closed state to allow a current to flow through the first supply line L1. When the first switching element 21A enters an OFF state, the first supply line L1 enters an open state to allow no current to flow through the first supply line L1.

The first switching element 21A according to the present embodiment is a field-effect transistor. The first switching element 21A is hereinafter referred to as a first FET 21A. The first supply line L1 is a supply line for electric power to be supplied from the power source 5 to the electric motor 3 (to the motor bridge circuit 7, in the present embodiment).

Second Switch Circuit

The second switch circuit 22 comprises at least a second switching element 22A. The second switching element 22A turns on and off a second supply line L2.

Specifically, when the second switching element 22A enters an ON state, the second supply line L2 enters a closed state to allow a current to flow through the second supply line L2. When the second switching element 22A enters an OFF state, the second supply line L2 enters an open state to allow no current to flow through the second supply line L2.

The second switching element 22A according to the present embodiment is a field-effect transistor. The second switching element 22A is hereinafter referred to as a second FET 22A. The second supply line L2 is a supply line for electric power to be supplied from the power source 5 to the motor bridge circuit 7, and is arranged in parallel with the first supply line L1.

Third Switch Circuit

The third switch circuit 23 comprises two switching elements, namely, third switching elements 23A and 23B, and turns on and off a third supply line L3. The third switching elements 23A and 23B according to the present embodiment are field-effect transistors.

The third supply line L3 is a supply line for electric power to be supplied from the power source 5 to the motor bridge circuit 7, and is arranged in parallel with the first supply line L1 and with the second supply line L2.

Controller

The controller 30 is configured with a microcomputer that comprises at least a CPU, a ROM, and a RAM. The controller 30 can control on/off of the first FET 21A and the second FET 22A.

A specific control method is as follows. A first signal S1 and a second signal S2 are input to the controller 30. The first signal S1 is a signal indicating an open/closed state of the first switch 11A. The second signal S2 is a signal indicating an open/closed state of the second switch 11B. The controller 30 turns on or off each of the first FET 21A and the second FET 22A based on these first and second signals S1 and S2.

More specifically, the controller 30 is configured to (a) bring the first FET 21A into an ON state when the first switch 11A is closed, (b) bring the first FET 21A into an OFF state when the first switch 11A is opened, (c) bring the second FET 22A into an ON state when the second switch 11B is closed, and (d) bring the second FET 22A into an OFF state when the second switch 11B is opened.

Figure 2:
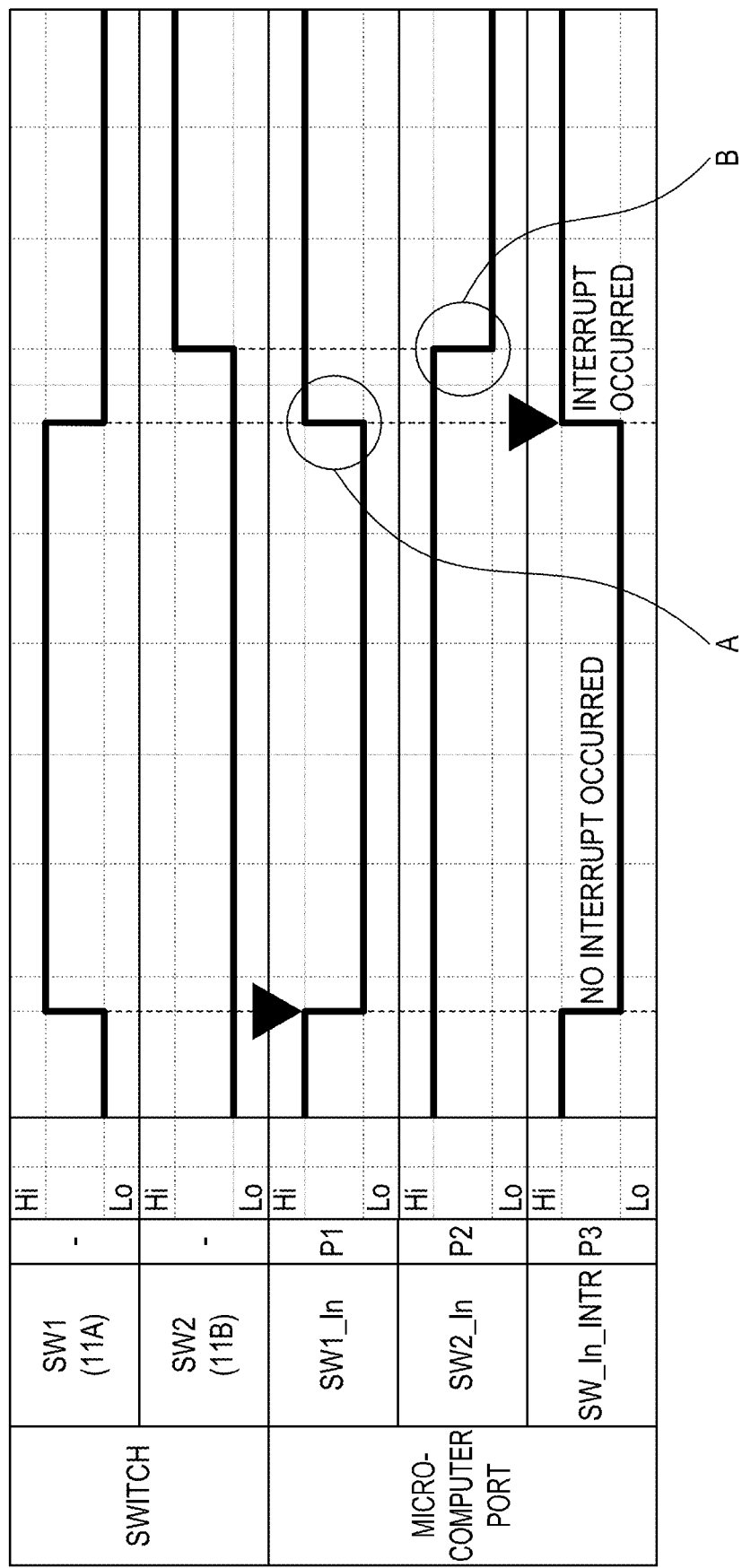
FIG. 2 is a timing chart for the switch circuit according to the first embodiment.

In the present embodiment, when the first switch 11A is in an open state (OFF), the first signal S1 is at a high potential (Hi level), and when the first switch 11A is in a closed state (ON), the first signal S1 is at a low potential (Lo level) (see FIG. 2). A relationship between the second switch 11B and the second signal S2 is the same as that between the first switch 11A and the first signal S1.

The controller 30 comprises at least one interrupt port P3. The first signal S1 and the second signal S2 are input to the common interrupt port P3. The first signal S1 is input to the interrupt port P3 through a signal line branched from a signal line leading to an input port P1 for the first switch 11A.

The second signal S2 is input to the interrupt port P3 through a signal line branched from a signal line leading to an input port P2 for the second switch 11B. Thus, diodes D1 and D2 for inhibiting backflow are provided on the respective signal lines leading to the interrupt port P3.

The diode D1 inhibits the first signal S1 from being input to the input port P2. The diode D2 inhibits the second signal S2 from being input to the input port P1. The interrupt port P3 is pulled up to a high potential (Hi).

Thus, when the input port P1 and the input port P2 are both at a high potential (Hi level), the interrupt port P3 is maintained at a high potential (Hi level). When either of the input port P1 and the input port P2 is at a high potential (Hi level) and the other is at a low potential (Lo level), the interrupt port P3 is at a low potential (Lo level).

In other words, when the first switch 11A and the second switch 11B are both in an open state (OFF), the interrupt port P3 is at a high potential (Hi level). When either of the first switch 11A and the second switch 11B is in an open state (OFF) and the other is in a closed state (ON), the interrupt port P3 is at a low potential (Lo level).

Accordingly, in a state where the first switch 11A is in a closed state (ON) and the second switch 11B is in an open state (OFF), when the state of the first switch 11A changes to an open state (OFF), the first switch 11A and the second switch 11B are both in an open state (OFF), and thus, the potential of the interrupt port P3 changes from a low potential (Lo level) to a high potential (Hi level).

Subsequently, when the state of the second switch 11B changes from an open state (OFF) to a closed state (ON), the potential of the interrupt port P3 changes from a high potential (Hi level) to a low potential (Lo level). That is, when an open/closed state of the first switch 11A or the second switch 11B changes, the potential of the interrupt port P3 changes.

The controller 30 also controls on/off of the third switch circuit 23, that is, the third switching elements 23A and 23B. When "automatic control" is chosen by a user, the controller 30 controls the third switch circuit 23 in accordance with an operation program stored in advance.

When "manual control" is chosen by a user, the controller 30 turns on or off each of the first switch circuit 21 and the second switch circuit 22 in accordance with the open/closed states of the first switch 11A and the second switch 11B.

3. Operation of Switch Circuit During Manual Control

The controller 30 can execute a first determination process, a second determination process, a third determination process, and a turn-off process, as well as a sleep mode and a wake-up process. At least the first determination process, the second determination process, the third determination process, and the turn-off process are executed by execution of software by the CPU. Such software is stored in advance in a non-volatile storage provided to the controller 30.

Sleep Mode

The sleep mode is, for example, a standby power mode. In the sleep mode, a process speed of the process (e.g., a polling process) other than an interrupt handling process is decreased to thereby reduce power consumption in the controller 30.

Specifically, in the sleep mode, for example, a process cycle (also referred to as a "clock frequency") is less than that during a non-sleep mode (hereinafter referred to as a "normal mode"). Accordingly, when the controller 30 shifts from the normal mode into the sleep mode, the process speed is decreased.

The polling process is a process of executing one or more processes sequentially at a specified cycle. The interrupt handling process is a process executed immediately when a specified state occurs in a signal input to the interrupt port P3.

First Determination Process

The first determination process is executed through the polling process during a normal mode. In the first determination process, it is determined whether the first switch 11A is in a closed state and whether the second switch 11B is in a closed state.

Specifically, in the first determination process, the controller 30 determines, at a specified cycle, whether the first signal S1 is at a low potential (Lo level) and whether the second signal S2 is at a low potential (Lo level). Then, the controller 30 brings the FET corresponding to the switch whose closed state has been detected into an ON state.

Second Determination Process

The second determination process, which is executed through the interrupt handling process, is a process of determining whether a state indicated by the signal input to the interrupt port P3, that is, either of the first signal S1 and the second signal S2, has changed from a closed state to an open state.

Specifically, the controller 30 determines whether the potential of either of the first signal S1 and the second signal S2 has changed from a low potential (Lo level) to a high potential (Hi level). At this point of time, in the second determination process according to the present embodiment, the state is determined to have changed from a closed state to an open state when the potential of the interrupt port P3 first changes from a low potential (Lo level) to a high potential (Hi level).

In other words, in the second determination process according to the present embodiment, when a rising edge (A in FIG. 2) of the signal is detected, it is determined that the state of either of the first switch 11A and the second switch 11B has changed from a closed state to an open state.

Third Determination Process

The third determination process, which is executed through the interrupt handling process during a sleep mode, is a process of determining whether the state indicated by the signal input to the interrupt port P3 has changed from an open state to a closed state.

Specifically, the controller 30 determines whether the potential of either of the first signal S1 and the second signal S2 has changed from a high potential (Hi level) to a low potential (Lo level). At this point of time, in the third determination process according to the present embodiment, the state is determined to have changed from an open state to a closed state when the potential of the interrupt port P3 first changes from a high potential (Hi level) to a low potential (Lo level).

In other words, in the third determination process according to the present embodiment, when a trailing edge (B in FIG. 2) of the signal is detected, it is determined that the state of either of the first switch 11A and the second switch 11B has changed form an open state to a closed state.

Turn-Off Process

The turn-off process is a process of bringing the FET in an ON state into an OFF state when the state is determined to have changed from a closed state to an open state in the second determination process. Specifically, when the state is determined to have changed from a closed state to an open state in the second determination process, the controller 30 transmits a command to enter an OFF state to both the first FET 21A and the second FET 22A.

In the present embodiment, as described above, when the open/closed state of each of the first switch 11A and the second switch 11B changes, a state where the first switch 11A and the second switch 11B are both in an open state (OFF) necessarily occurs.

Thus, for example when the state of the first switch 11A changes from a closed state (ON) to an open state (OFF) and the state of the second switch 11B changes from an open state (OFF) to a closed state (ON), a state where the first switch 11A and the second switch 11B are both in an open state (OFF) occurs as shown in FIG. 2.

At this point of time, in the present embodiment, it is determined whether the state indicated by the signal input to the interrupt port P3 has changed from a closed state (ON) to an open state (OFF), and thus, the controller 30 detects that the first switch 11A has entered an open state (OFF) before detecting that the second switch 11B has entered a closed state (ON).

Accordingly, at the point of time when the controller 30 detects that the first switch 11A has entered an open state (OFF), the controller 30 has not transmitted the command to enter an ON state to the second FET 22A.

In other words, at the point of time when the controller 30 detects that the first switch 11A has entered the open state (OFF), the second FET 22A is in an OFF state, and the first FET 21A is in an ON state.

Accordingly, when the controller 30 transmits the command to enter an OFF state to both the first FET 21A and the second FET 22A at such a timing, the state of the first FET 21A changes from an ON state to an OFF state, and the OFF state of the second FET 22A is maintained.

Subsequently, when the controller 30 detects that the second switch 11B has entered a closed state (ON), the controller 30 transmits a command to enter an ON state to the second FET 22A. Such procedures result in avoiding the first FET 21A and the second FET 22A from both entering an ON state.

Wake-Up Process

The wake-up process, which is executed during a sleep mode, is a process of cancelling the sleep mode to shift into a normal mode and of prohibiting execution of the third determination process.

The controller 30 executes the sleep mode after providing a state where at least the second determination process and the third determination process are executable. Then, when the controller 30 determines that the signal has changed, in other words, that at least one of the first switch 11A or the second switch 11B has been operated, in the second determination process or the third determination process during the sleep mode, the controller 30 executes the wake-up process.

Operation Flow in Switch Circuit During Manual Control

Figure 3:
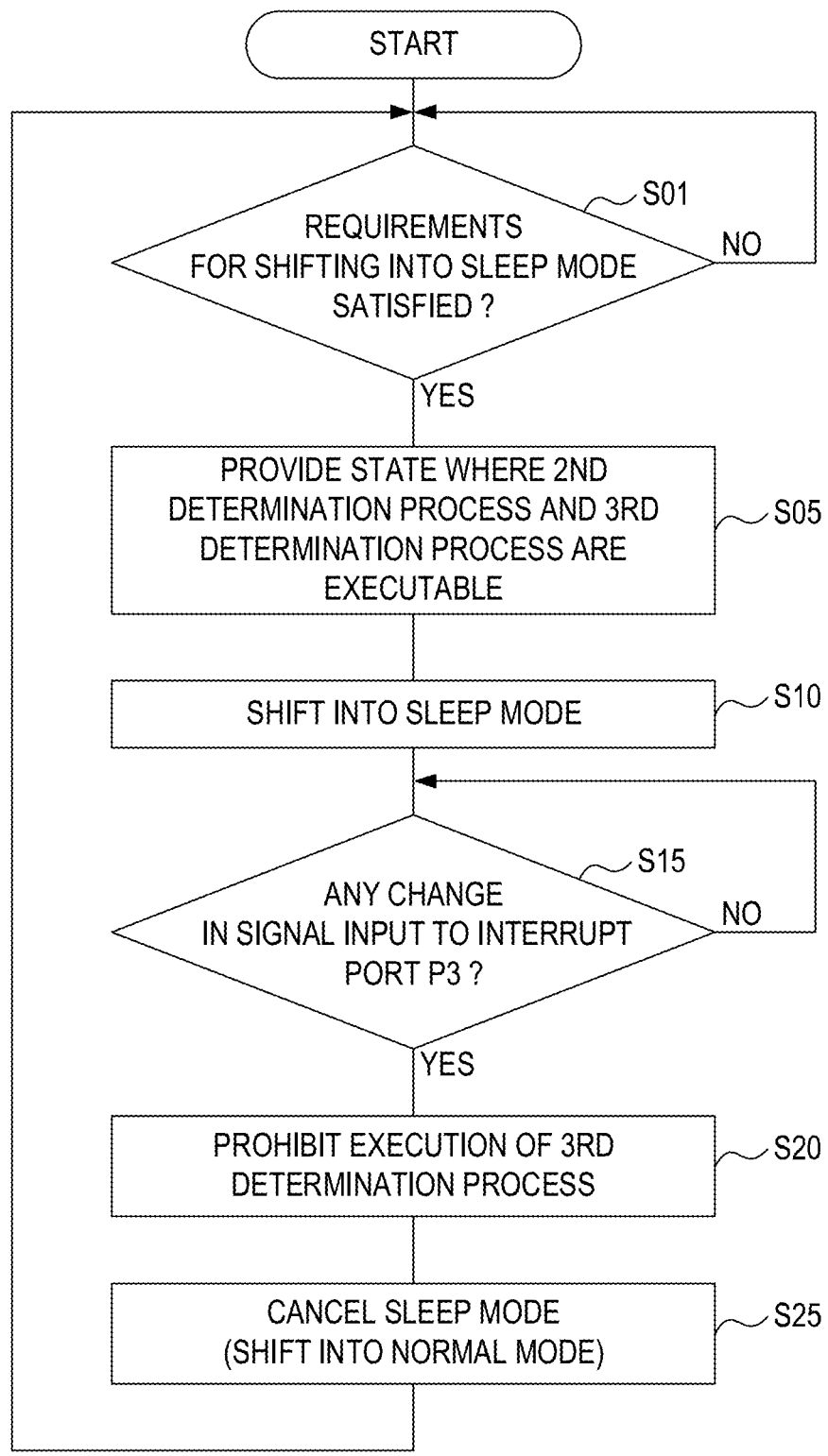
FIG. 3 is a flow chart showing operation of the switch circuit according to the first embodiment.

FIG. 3 is a flow chart showing an operation flow in the switch circuit 1 during the manual control. The operation flow is started when "manual control" is chosen by a user. When the operation flow is started, the controller 30 determines whether requirements for shifting into a sleep mode are satisfied (S01).

Examples of the requirements for shifting into a sleep mode may include a case where a state in which the operation switch 11 is not operated has continued for a specified period of time or longer.

When it is determined that the requirements for shifting into a sleep mode are satisfied (S01: YES), the controller 30 provides a state where the second determination process and the third determination process are executable (S05), and then shifts into a sleep mode (S10).

Upon shifting into the sleep mode, the controller 30 determines whether there has been any change in the signal input to the interrupt port P3 (S15). When it is determined that there has been a change in the signal input to the interrupt port P3 (S15: YES), the controller 30 prohibits execution of the third determination process (S20), and then cancels the sleep mode to shift into a normal mode (S25).

4. Features of Switch Circuit According to the Present Embodiment

In the switch circuit 1 according to the present embodiment, the determination of whether the state of the first switch 11A or the second switch 11B has changed from a closed state to an open state is made through the interrupt handling process, and thus, such a determination is made in an extremely short period of time as compared with a case where such a determination is made through the polling process.

Therefore, generation of a through current caused by a "delay in detection timing" can be inhibited. This may lead to inhibition of damage to the first FET 21A and the second FET 22A.

In the meantime, some specification of the controller 30 and/or some specification of the vehicle seat may cause a case where the number of the interrupt port P3 usable for an OFF determination falls short of the number of the switches. In contrast, in the switch circuit 1, the first signal S1 and the second signal S2 are input to the interrupt port P3 in common, and thus, at least one interrupt port is sufficient.

Accordingly, with the switch circuit 1, the turn-off process can be executed using the interrupt handling process even in the case where the number of the interrupt port usable for the OFF determination falls short of the number of the switches.

With such a configuration of the switch circuit 1, generation of a through current can be inhibited without employing a controller with a process speed capable of inhibiting generation of a through current through the polling process alone, or an expensive controller provided with an ample number of the interrupt ports.

In the switch circuit 1, since generation of a through current can be inhibited with the controller 30 with a small number of the interrupt port P3, increase in size of the controller 30 is inhibited, and thus, ease of mounting the controller 30 to the vehicle seat is not impaired.

When the OFF determination is made, the controller 30 immediately brings about an OFF state of each FET without determining which FET corresponds to the opened switch. This results in achieving the OFF state of each FET in an extremely short period of time, and thus, generation of a through current may be reliably inhibited.

In the second determination process, the state is determined to have changed from a closed state to an open state when the state first changes from the closed state. That is, in the second determination process, the determination is made based on the edge of the signal (see A in FIG. 2).

Thus, even in a case where chattering occurs in the first switch 11A and the second switch 11B, the OFF determination is not affected by such chattering. This makes it possible to make the OFF determination in an extremely short period of time, thus reliably inhibiting generation of a through current.

During the sleep mode, the controller 30 can also execute the third determination process in addition to the second determination process, and when the signal is determined to have changed in the second determination process or the third determination process, the controller 30 cancels the sleep mode and prohibits execution of the third determination process.

Thus, when any operation is performed on either of the first switch 11A and the second switch 11B, the sleep mode is canceled. This may enable the controller 30 to quickly react to the operation by a user.

OTHER EMBODIMENTS

The controller 30 according to the above-described embodiment transmits the command to enter an OFF state to both the first FET 21A and the second FET 22A when the state is determined to have changed from the closed state to the open state in the second determination process.

However, the present disclosure is not limited to this. Specifically, in the present disclosure, for example, the controller 30 may determine which FET corresponds to the opened switch and then transmit the command to enter an OFF state to the relevant FET alone.

In the above-described embodiment, the FET is employed as the switching element. However, the present disclosure is not limited to this. Specifically, in the present disclosure, for example, an electromagnetic relay may be employed as the switching element.

In the second determination process and the third determination process according to the above-described embodiment, the determination is made when the signal first changes, in other words, based on the edge of the signal. However, since the speed of the interrupt handling process is high enough as compared with the polling process, the present disclosure is not limited to this.

The controller 30 according to the above-described embodiment executes the sleep mode after providing the state where at least the second determination process and the third determination process are executable. However, the present disclosure is not limited to this. Specifically, in the present disclosure, for example, the controller 30 may execute the sleep mode after providing a state where the second determination process or the third determination process is executable.

In the above-described embodiment, the example is illustrated in which the electric motor 3 is the load. However, the present disclosure is not limited to this. Specifically, the present disclosure may also be applied to a configuration in which, for example, a heating element such as a heater is the load and a switch circuit controls current supply to the heating element.

In the above-described embodiment, the interrupt port P3 is pulled up to a high potential (Hi). However, the present disclosure is not limited to this. Specifically, in the present disclosure, for example, the interrupt port P3 may be pulled down to a low potential (Lo). In such a case, the orientations of the diodes D1 and D2 need to be reversed from those shown in FIG. 1.

In the above-described embodiments, the vehicle seat according to the present disclosure is applied to an automobile. However, application of the disclosure herein is not limited to this. Specifically, the present disclosure may also be applied to, for example, a seat used in vehicles such as railroad vehicles, ships, or aircraft, and to a stationary seat used in theaters, at home, or in other places.

Moreover, the present disclosure only needs to be consistent with the gist of the disclosure described in the above-described embodiments, and is not limited by the above-described embodiments. Therefore, a configuration may be employed in which at least two embodiments among the above-described embodiments are combined together or in which any of the elements shown diagrammatically or the elements described with reference numerals in the above-described embodiments is not used.

What is claimed is:

1. A switch circuit configured to control electric power to be supplied to a load mounted to a vehicle seat, the switch circuit comprising:
    a first switch and a second switch configured to be operated to open and close mechanically;
    a first switching element configured to turn on and off a first supply line for the electric power to be supplied from a power source to the load;
    a second switching element configured to turn on and off a second supply line for the electric power to be supplied from the power source to the load, the second supply line being arranged in parallel with the first supply line; and
    a controller configured with a microcomputer, to which a first signal indicating an open/closed state of the first switch and a second signal indicating an open/closed state of the second switch are input, the controller being configured to turn on or off each of the first switching element and the second switching element based on the first signal and the second signal, the first signal and the second signal being input to an interrupt port in common;
    the controller being configured to execute:
        a first determination process of determining whether the first switch is in a closed state and whether the second switch is in a closed state through a polling process;
        a second determination process of determining whether a state indicated by either of the first and second signals input to the interrupt port has changed from the closed state to an open state; and
        a turn-off process of bringing either of the first and second switching elements that is in an ON state into an OFF state when the state is determined to have changed from the closed state to the open state in the second determination process.

2. The switch circuit according to claim 1, wherein, in the second determination process, the state is determined to have changed from the closed state to the open state when the state first changes from the closed state.

3. The switch circuit according to claim 1, wherein the controller is configured to execute a sleep mode, the sleep mode being a standby power mode, wherein, the controller is configured to, during the sleep mode, also execute, in addition to the second determination process, a third determination process of determining whether the state indicated by either of the first and second signals input to the interrupt port has changed from the open state to the closed state, and wherein the controller is configured to, when the state indicated by either of the first and second signals is determined to have changed in the second determination process or the third determination process, cancel the sleep mode and prohibit execution of the third determination process.

4. The switch circuit according to claim 2, wherein the controller is configured to execute a sleep mode, the sleep mode being a standby power mode, wherein the controller is configured to, during the sleep mode, also execute, in addition to the second determination process, a third determination process of determining whether the state indicated by either of the first and second signals input to the interrupt port has changed from the open state to the closed state, and wherein the controller is configured to, when the state indicated by either of the first and second signals is determined to have changed in the second determination process or the third determination process, cancel the sleep mode and prohibit execution of the third determination process.

* * * * *